United States Patent [19]
Robinson

[11] Patent Number: 5,877,069
[45] Date of Patent: Mar. 2, 1999

[54] METHOD FOR ELECTROCHEMICAL LOCAL OXIDATION OF SILICON

[75] Inventor: Karl M. Robinson, Boise, Id.

[73] Assignee: Micron Technology, Inc., Boise, Id.

[21] Appl. No.: 710,370

[22] Filed: Sep. 16, 1996

[51] Int. Cl.$^6$ .................................................. H01L 21/76
[52] U.S. Cl. .......................... 438/441; 438/439; 438/225; 438/297
[58] Field of Search .................................... 438/441, 439, 438/225, 297, 362, 960

[56] References Cited

U.S. PATENT DOCUMENTS

| | | | |
|---|---|---|---|
| 3,954,523 | 5/1976 | Magdo et al. | 438/441 |
| 4,016,017 | 4/1977 | Aboaf et al. | 438/441 |
| 4,056,415 | 11/1977 | Cook, Jr. et al. | 438/441 |
| 5,156,896 | 10/1992 | Katoh et al. | 438/441 |

OTHER PUBLICATIONS

T.F. Hung, et al., "A New Design of Anodic Oxidation Reactor for High–Quality Gate Oxide Preparation," J. Electrochem. Soc., vol. 138, No. 12, Dec. 1996, pp. 3747–3750.

D. Landheer, et al., "Electrical Properties of Thin Anodic Oxides Formed on Silicon in Aqueous NH$_4$OH Solutions," J. Electrochem. Soc., vol. 141, No. 5, May 1994, pp. 1309–1312.

M.J.J. Theunissen, "Etch Channel Formation during Anodic Dissolution of N–Type Silicon in Aqueous Hydrofluoric Acid," J. Electrochemical Soc., Mar. 1972, pp. 351–360.

J.A. Bardwell, et al., "Growth and Characterization of Room Temperature Anodic SiO$_2$ Films," J. Electrochem. Soc., vol. 140, No. 8, Aug. 1993, pp. 2135–2138.

G. Mende, et al., "The Electrophysical Properties of Anodically Grown Silicon Oxide Film," Thin Solid Films, 168 (1989), pp. 51–60.

P. Schmuki et al., "In Situ Characterization of Anodic Silicon Oxide Films by AC Impedance Measurements," J. Electrochem. Soc., vol. 142, No. 5, May 1995, pp. 1705–1712.

*Primary Examiner*—Trung Dang
*Attorney, Agent, or Firm*—Workman, Nydegger & Seeley

[57] ABSTRACT

A method for electrochemical local oxidation of silicon of selected regions of a silicon substrate of a semiconductor wafer avoids the formation of bird's beak structures of the prior art. The method involves the initial formation of a patterned generally nonconductive layer such as silicon nitride on a silicon substrate of a semiconductor wafer. The semiconductor wafer is then immersed in a bath of oxidizing electrolyte solutions such as pure water, acid, or ammonium. While immersed, the semiconductor wafer is subjected to an electrical field. The electrical field is created by connecting a power source both to a cathode located within the bath and to the semiconductor wafer, thereby employing the semiconductor wafer as an anode. The electrical field causes the oxygen of the bath to react with the silicon substrate and form patterned oxide regions in the locations where the silicon substrate was left unmasked by the patterned generally non-conductive layer. The directionality of the electrical field causes the patterned oxide regions to be formed with substantially anisotropic sidewalls. The anisotropic sidewalls enable the patterned oxide regions to be more densely packed and to have high dielectric properties. The semiconductor wafer is annealed after the bath to densify and remove moisture from the patterned regions of silicon dioxide.

40 Claims, 3 Drawing Sheets

METHOD FOR ELECTROCHEMICAL LOCAL OXIDATION OF SILICON

BACKGROUND OF THE INVENTION

1. The Field of the Invention

The present invention relates to methods for forming patterned dielectric regions on semiconductor wafers. More particularly, the present invention relates to methods of locally oxidizing silicon substrates of semiconductor wafers to grow patterned regions of oxide without the formation of bird's beak structures and without the need for reflowing the oxide. The method of the present invention is particularly useful in forming thin, submicron-sized, patterned oxide regions for use as spacers and gate oxides of MOS integrated circuits.

2. The Relevant Technology

Integrated circuits are currently manufactured by an elaborate process in which scores of electronic devices are integrally formed on semiconductor wafers. The conventional electronic devices formed on a semiconductor wafer in the process of fabricating integrated circuits include capacitors, resistors, transistors, diodes, and the like. In advanced integrated circuit manufacturing processes, hundreds of thousands of these electronic devices are formed on a single semiconductor wafer.

One frequently conducted portion of the process of manufacturing an integrated circuit is the formation of an insulating layer on a silicon substrate of a semiconductor wafer from which the integrated circuit is formed. Insulating layers are frequently formed from oxides of silicon, typically silicon dioxide ($SiO_2$). Silicon dioxide and related oxides of silicon such as borophosphosilicate glass (BPSG) are considered advantageous for forming insulating layer, due to the simplicity of the processes by which they are grown. For example, when forming a blanket oxide layer, or "field oxide," a silicon substrate is simply exposed to oxygen or oxygen containing gases or liquids, usually at an elevated temperature, and the oxide grows from the resulting reaction. This simple process is greatly complicated, however, when patterned or "local" oxide regions are to be formed on the semiconductor wafer.

Applications where patterned oxide regions are used in the integrated circuit manufacturing process include the formation of passivation layers between devices located on different levels of the semiconductor wafer, the formation of spacers between electronic devices located on the same level of the semiconductor wafer, and the formation of thin gate oxides for use in MOS transistors. In forming such layers, one of two basic processes is conventionally used, namely chemical vapor deposition and thermal oxidation.

Chemical vapor deposition typically involves the pyrolytic decomposition of a silicon-containing precursor material in a chemical vapor deposition chamber. One frequently used precursor material from which the silicon oxide is decomposed comprises tetraethylorthosilicate ($Si(C_2H_5)_4$), also known as TEOS. In the decomposition process, the precursor material is reacted under high temperature with oxygen to result in the growth of a layer of silicon dioxide together with easily removed byproducts.

In order to form patterned silicon dioxide regions with chemical vapor deposition, an underlying silicon substrate is first patterned so as to form recesses in the topography thereof, such as trenches and holes. The precursor layer is then grown as a blanket oxide layer. Dopants are normally added to form a layer of BPSG, which reflows at lower temperatures than undoped silicon dioxide over the patterned silicon layer. The BPSG is later reflowed to completely fill the recesses in the topography of the silicon substrate and leave a planar surface. The portion of the silicon oxide above the recesses is then removed with an etch-back process or by chemical mechanical polishing.

One problem with the conventional chemical vapor deposition process for forming patterned oxide regions is that numerous steps are required to pattern the insulating regions. The numerous steps add significantly to the complexity and expense of the integrated circuit manufacturing process.

The conventional method of forming patterned insulating regions with thermal oxidation is referred to as the Local Oxidation of Silicon (LOCOS) and involves masking a silicon substrate and exposing the unmasked portions of the silicon substrate to air or water vapor at temperatures of about 900° C. to 1200° C. As continued exposure to heat damages crystalline structures within the integrated circuit wafer or the devices located thereon, a process of rapid thermal processing (RTP) is used to ramp the temperature of the wafer up and down quickly. Rapid thermal processing has the drawback of reduced throughput, as the wafers must be processed one at a time.

Another drawback to the LOCOS process is illustrated in FIG. 1. Under the LOCOS process, the silicon substrate is patterned using nitride spacers. The patterning arrangement is shown in FIG. 1, where a silicon substrate 12 is situated on a semiconductor wafer 10. Formed on silicon substrate 12 is a patterned silicon nitride mask layer 14. Subsequent exposure of semiconductor wafer 10 to oxygen through silicon nitride mask layer 14 at an elevated temperature results in the growth of silicon dioxide spacers 16 in the areas of silicon substrate 12 that are not covered by silicon nitride mask layer 14.

Silicon dioxide spacers 16 are typically thicker at the center and taper toward the edges, forming what are known as "bird's beak" structures 18 at the far edges. Bird's beak structures 18 tend to undercut silicon nitride mask 14, causing a deviation in the critical dimensions to be maintained during subsequent etch steps. The nonuniform shape of silicon dioxide spacers 16 also causes a reduction in the dielectric properties thereof. Furthermore, the protruding bird's beak structures 18 of silicon dioxide spacers 16 hinder miniaturization efforts, due to the low dielectric properties and their pointed geometry which prohibits them from being densely packed. Miniaturization would necessitate that silicon dioxide spacers 16 be moved closer together. This would cause them to encroach on one another and would thereby alter the relationship of silicon dioxide spacers 16 with electronic devices enclosed by silicon dioxide spacers 16, such as transistors. This change in relationship caused by the encroachment of bird's beak structures 18 would result in gate oxides under the transistors being increased on one side unevenly so as to lower the speed and performance of the transistors.

It should be apparent from the above discussion that a need exists in the art for a method for forming patterned oxide regions that has a reduced amount of steps from conventional CVD deposition and that avoids formation of the bird's beak structures that result from conventional thermal oxidation. Such a method would be especially beneficial if oxide spacers and gate oxides with high dielectric properties could be formed with the method in a manner that would maintain or increase throughput of the MOS integrated circuit manufacturing process.

3

SUMMARY OF THE INVENTION

A method is provided for electrochemically growing patterned oxide regions on a semiconductor wafer surface. Under the method of the present invention, a semiconductor wafer is provided with a silicon substrate in which one or more patterned oxide regions are to be formed. The silicon substrate is cleaned and then masked with a patterned substrate. The locations in which the silicon oxide regions are to be grown are left unmasked. The patterned substrate will preferably be an adhering non-conducting substrate, with suitable examples including photoresist and silicon nitride.

Once provided the silicon substrate has the patterned substrate formed thereon, the wafer is immersed in a bath of oxidizing liquid electrolyte. The oxidizing liquid electrolyte may comprise for example, water, acid, or ammonium. Ammonium is preferred, and preferred forms of ammonium include dilute hydrous $NH_4OH$, TMAH, and TEOH.

While immersed in the bath of oxidizing liquid electrolyte, the semiconductor wafer is connected to an electrical circuit. The electrical circuit is provided with a power source, a cathode, and clips or other means for connecting the semiconductor wafer as an anode. Once the wafer is immersed in the bath and connected as an anode, the power source is enabled, causing an electrical field to be generated between the cathode, which is also immersed, and the wafer. The electrical field contributes an energy that causes a reaction between the oxidizing liquid electrolyte and the exposed portions of the silicon substrate. The reaction causes the growth of silicon dioxide in the regions of the silicon substrate that are unmasked.

The electrical field is normal to the semiconductor wafer so as to prohibit lateral oxide growth, causing the silicon dioxide to be formed as regions with substantially straight or anisotropic sidewalls parallel to the electric field and having substantially the same critical dimensions as the unmasked regions of the silicon substrate. Bird's beak structures are thus avoided.

The depth to which the silicon dioxide regions are grown is controlled by the voltage level and duration of application of the electrical field. Also, by controlling the voltage level, the silicon dioxide regions can be grown in a more rapid manner than by prior art processes, thus increasing the throughput of the integrated circuit manufacturing process.

It is also generally necessary in forming patterned oxide regions to anneal the semiconductor wafer. The anneal is performed in a tube furnace and serves to densify the patterned oxide regions and remove liquid remaining in the patterned oxide regions.

In an alternate embodiment, only a selected portion of the silicon substrate is immersed in the oxidizing liquid electrolyte and subjected to the electrical field. This allows for localized growth of oxide without masking the entire wafer. The alternative embodiment can be used where, for example, existing silicon dioxide regions need to be reinforced or repaired.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings briefly outlined below.

DETAILED DESCRIPTION OF THE PREFERRED EMBODIMENTS

Figure 1:
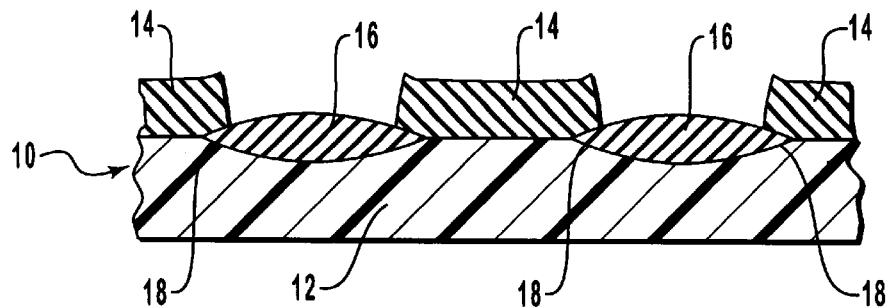
FIG. 1 is a cross-sectional view of a portion of a semiconductor wafer showing the results of the conventional method of forming two insulating field oxide regions of silicon dioxide, each having bird's beak structures.
Figure 2:
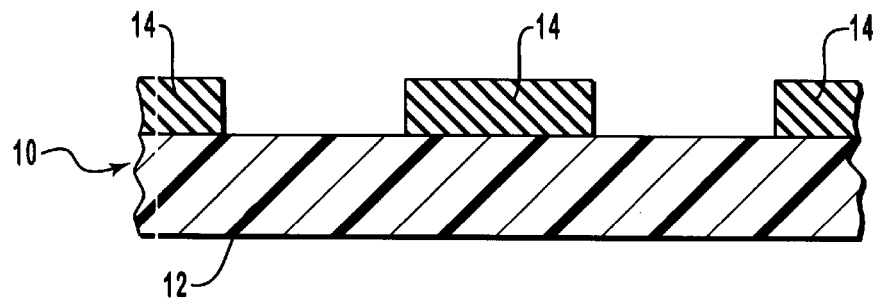
FIG. 2 is a cross-sectional view of a portion of a semiconductor wafer showing an initial step in the method of the present invention, namely the formation of a silicon nitride mask layer.

FIG. 2 illustrates an initial step in the method of the present invention. Shown in FIG. 2 is a semiconductor wafer 10 comprised of a silicon substrate 12. In the initial step of the method of the present invention, the surface of silicon substrate 12 is patterned with a generally non-conductive layer. Suitable examples of the generally non-conductive layer include photoresist and silicon nitride. Any substance that is non-conductive, that can be patterned, and that will adhere to silicon substrate 12 can be used. In the depicted embodiment, the adhering non-conductive layer comprises a patterned silicon nitride layer 14 which is patterned with photolithography in substantially the same manner as the conventional LOCOS process of the prior art. The surface of silicon substrate 12 must also be cleaned. Any suitable standard cleaning process can be used. One preferred cleaning process is known as an RCA clean in the art.

Figure 3:
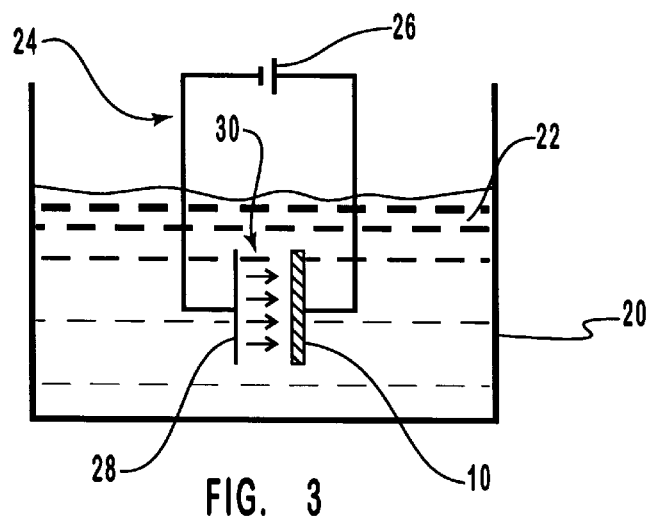
FIG. 3 is a schematic view depicting an electrolyte bath and electrical circuit used in electrochemical oxidation under one embodiment of the method of the present invention.

After the surface of silicon substrate 12 has been cleaned, semiconductor wafer 10 or a portion of semiconductor wafer 10 is immersed in an oxidizing liquid electrolyte. In the depicted embodiment of FIG. 3, the entirety of semiconductor wafer 10 is immersed in a bath of electrolyte solution 22 within a tank 20. While only a single semiconductor wafer 10 is depicted, whole batches of wafers can be placed in a conducting boat and immersed in tank 20 at one time.

The oxidizing liquid electrolyte can be hydrous, and may comprise pure water. It can also be anhydrous. Acids and bases containing oxygen, and especially those containing HO groups, are suitable. Bases are preferred, and ammonium is particularly preferred, as it tends to incorporate less undesirable contaminates such as sodium or potassium mobile ionic contaminants that occur in oxides grown from electrolytes such as acids. Highly preferred examples of ammonium include $NH_4OH$, TMAH, and TEOH. Preferred concentrations of these ammonium electrolytes fall within the range of between 0.01 molar to 5 molar. Acetonitrile-based electrolytes may also be used.

Once semiconductor wafer 10 is placed in the bath of electrolyte solution 22, semiconductor wafer 10 is connected to an electrical circuit 24 to form an anode thereof. A cathode 28, serving as a counter-electrode, is immersed in electrolyte solution 22 and is connected to a power source 26 to complete the circuit. In the depicted embodiment of FIG. 3, cathode 28 is constructed of platinum gauze. Platinum gauze is preferred because it is inert, produces little or no contamination of the surface, and is easy to clean. Once semiconductor wafer 10 is immersed and connected to electrical circuit 24, a potential is applied to electrical circuit 24 with voltage source 26. The potential between cathode 28 and semiconductor wafer 10 creates an electrical field 30 that imparts an energy causing the silicon of silicon substrate 10 to react with oxygen in electrolyte solution 22 and form silicon dioxide ($SiO_2$). The voltage and the period of time for applying the voltage is selected according to the depth of silicon dioxide to be grown in silicon substrate 12. It may also be desirable to vary the selected voltage during the period of time for applying a selected voltage between silicon substrate 12 and the cathode so as to alter the formation of silicon dioxide.

Figure 4:
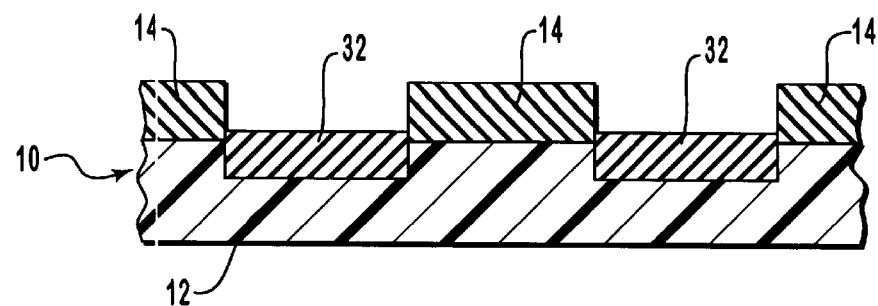
FIG. 4 is a cross-sectional view of the portion of a semiconductor wafer of FIG. 2 showing the results of further steps in the method of the present invention of immersing the semiconductor wafer in an electrolyte bath and concurrently applying an electric field to the semiconductor wafer so as to form silicon dioxide regions in regions that are unmasked by the silicon nitride mask layer.

Typically, the silicon dioxide is formed in accordance with the reaction: $Si+O_2=SiO_2$. Of course, if electrolyte solution 22 is hydrous, or if dopants such as boron or phosphorous are used, the reaction will be more complex. Electrical field 30 is directional, and acts on semiconductor wafer 10 at an angle that is essentially normal to silicon substrate 12. Silicon nitride mask layer 14, due to its non-conductivity, blocks electrical field 30 from reaching the portions of silicon substrate 12 which are masked. Without the energy imparted by electrical field 30, the masked portions of silicon substrate 12 do not react with electrolyte solution 22, and do not oxidize. Thus, as shown in FIG. 4, the newly formed silicon dioxide regions 32 form substantially anisotropic edges, and the bird's beak structures of the prior art have been eliminated. Silicon dioxide regions 32 can be field oxide or gate oxide regions for the purpose of subsequent processing.

Figure 5:
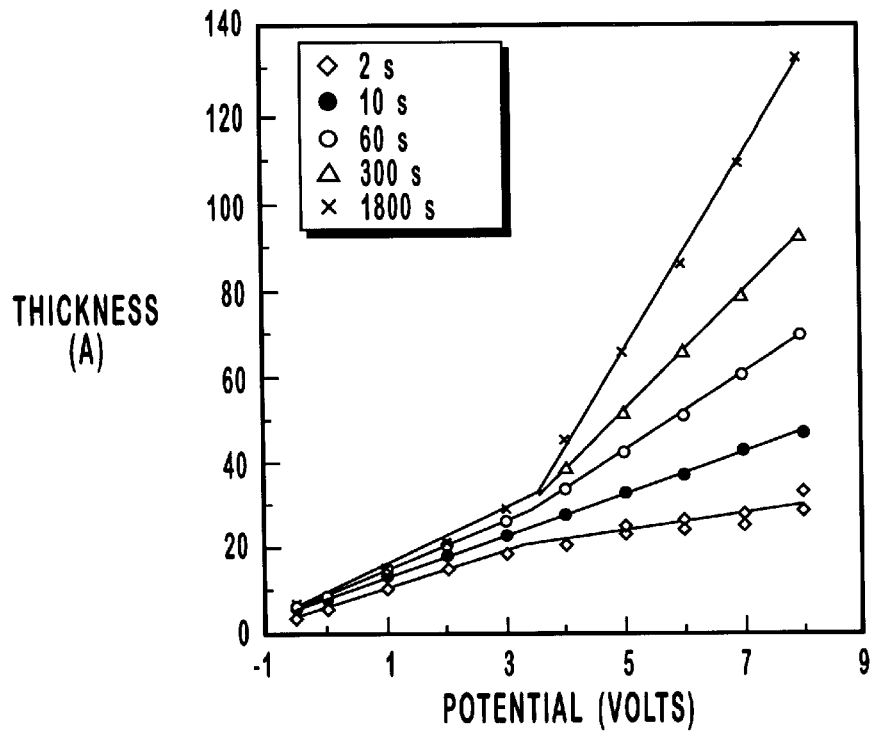
FIG. 5 is a chart showing the relationship of time and voltage to the thickness of the silicon dioxide region formed under the method of the present invention.

The speed and depth of the reaction is controlled by the particular electrolyte, as well as the time and voltage as depicted in the illustration of FIG. 5. As shown therein, for a 0.1 molar ammonium electrolyte, applying a higher voltage or applying the voltage for a greater length of time while silicon substrate 12 is concurrently immersed in electrolyte solution 22 will result in a greater thickness of silicon dioxide regions 32. In this manner, by selecting the strength and duration of electrical field 30, the thickness of silicon dioxide regions 32 is easily controlled in a predictable manner. Increasing the voltage applied to electrical circuit 24 also increases the rate of growth of silicide dioxide regions 32 so as to increase the throughput of the integrated circuit manufacturing process. The method is capable of creating oxides with dielectric properties commensurate with thermal and chemical vapor deposition oxide growth methods.

Figure 6:
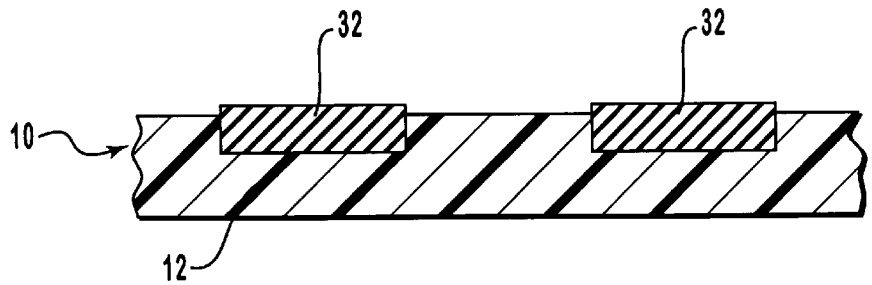
FIG. 6 is a cross-sectional view of the portion of the semiconductor wafer of FIG. 4 showing the results of the method of the present invention in the form of two silicon oxide regions located on the semiconductor wafer, where the silicon nitride mask layer has been stripped from the silicon substrate.

Once silicon dioxide regions 32 are grown to a sufficient depth, semiconductor wafer 10 is removed from tank 20 and cleaned. Thereafter, a strip process or an etch selective to oxide is used to remove patterned silicon nitride layer 14. The result of the process is shown in FIG. 6 where silicon substrate 12 has formed thereon two silicon dioxide regions 32. Silicon dioxide regions 32 each have substantially the same dimensions as the unmasked regions and exhibit substantially anisotropic sidewalls. An annealing step may follow to remove moisture (e.g. water) from silicon dioxide regions 32.

Figure 7:
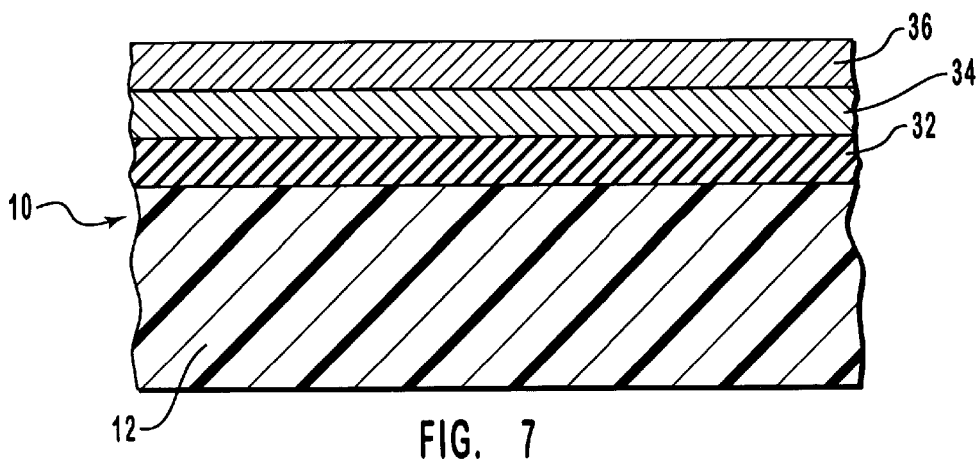
FIGS. 7–8 are a cross-sectional views of multiple regions of silicon dioxide layered in silicon as are formed by the inventive method.

Silicon dioxide regions grown according to the inventive method can be grown in a layering mechanism, as is depicted in FIG. 7 which shows silicon dioxide regions 32 and 36 formed, respectively, on silicon substrate 12 and a layer of silicon 34. Silicon dioxide region 36 can be deposited by silicon based molecules in solution, or can be formed by degradation of the silicon of layer of silicon 34 via the surface oxidation thereof.

By way of example for a method of forming the structure seen in FIG. 7, the structure of FIG. 6 is first formed. Then, layer of silicon 34 is then formed upon silicon dioxide region 32. Layer of silicon 34 is subsequently patterned with a layer of silicon nitride, as in FIG. 2, to leave an unmasked region of layer of silicon 34. Thereafter, unmasked region of layer of silicon 34 is exposed to an electrolyte solution. This is preferably done as discussed above for FIG. 3, wherein semiconductor wafer 10 is immersed in tank 20 containing electrolyte solution 22. A voltage is selected, as discussed above in conjunction with FIG. 5, for a desired thickness of a silicon dioxide region 36 and is applied between layer of silicon 34 and a cathode such as cathode 28 of FIG. 3. Cathode 28 is placed in electrical contact with the ammonium compound so as to create an electrical field 30 between cathode 28 and layer of silicon 34, thereby causing layer of silicon 34 to react with the ammonium compound to form silicon dioxide region 36 in layer of silicon 34. Silicon dioxide region 36 is formed with a selected depth within layer of silicon 34 at the unmasked region of layer of silicon 34. Finally, semiconductor wafer 10 is removed from the ammonium compound, the patterned layer of silicon nitride is removed from layer of silicon 34, and semiconductor wafer 10 is annealed to densify and remove liquid from silicon dioxide region 36 in layer of silicon 34.

Figure 8:
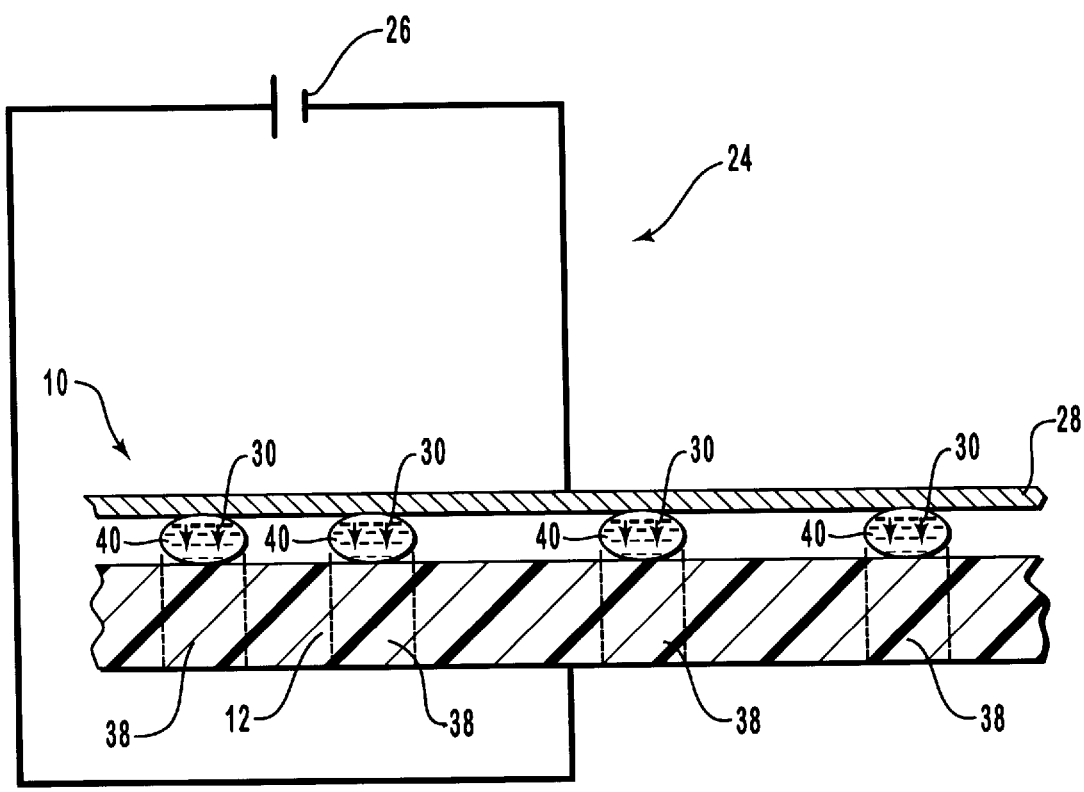

While the method of the present invention has been illustrated in relation to one specific embodiment, the invention is not intended to be restricted to this embodiment and may be conducted in other manners as well. For instance, the whole wafer need not be totally immersed when growing silicon dioxide regions 32. Instead, as shown in FIG. 8, electrolyte solution 22 can be applied locally to specific portions 38 of silicon substrate 10 in specific quantities such as drops 40. A potential selected as described above is then applied to specific portions 38 of silicon substrate 10 to create localized electrical fields 30. In the depicted embodiment, this is conducted by locating cathode 28 a sufficient distance from semiconductor wafer 10 that localized electrical fields 30 flow through conductive drops 40, rather than through ambient surrounding drops 40. In this manner, silicon dioxide is grown locally without masking the entirety of semiconductor wafer 10. This embodiment can be used, for example, to repair or reinforce areas that are not fully oxidized.

Small features, limited to the resolution limits of photolithography, can be simultaneously grown using the method of the present invention. Multiple uses are contemplate, including oxide spacers such as silicon dioxide regions 32 of the depicted embodiment of FIG. 6. In a further embodiment, thin, discrete gate oxides can be formed in essentially the manner described above, with the thickness of the patterned oxide region controlled in the described manner.

Thus, the method of the present invention overcomes the problems in the art of critical dimension maintenance, dielectric quality, and space consumption that result from the bird's beak structure formed as a result of conventional thermal oxidation. The method of the present invention is faster and more controllable than prior art methods. The patterned oxide regions formed by the method exhibit high dielectric properties, can be easily tailored to specific depths, and can be used to grow patterned submicron features without the need for the reflow step of conventional chemical vapor oxide deposition.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming a patterned oxide region on a silicon substrate of a semiconductor wafer, the method comprising:
   (a) masking the silicon substrate with a generally non-conductive layer to leave an unmasked region of the silicon substrate;
   (b) exposing at least a portion of the silicon substrate to an oxidizing liquid electrolyte, the portion of the silicon substrate immersed in the oxidizing liquid electrolyte containing therein the unmasked region of the silicon substrate; and
   (c) applying a voltage to the silicon substrate across the oxidizing liquid electrolyte thereby causing the silicon substrate to react with the oxidizing liquid electrolyte to form a patterned oxide region in the silicon substrate at the unmasked region of the silicon substrate.

2. A method as recited in claim 1, wherein the voltage is applied to the silicon substrate with a cathode that is in electrical contact with the oxidizing liquid electrolyte so as to create an electric field between the cathode and the silicon substrate in order to cause the silicon substrate to react with the oxidizing liquid electrolyte.

3. A method as recited in claim 1, wherein the silicon substrate is immersed in the oxidizing liquid electrolyte.

4. A method as recited in claim 1, wherein the patterned oxide region comprises silicon dioxide.

5. A method as recited in claim 1, further comprising the steps of:
   (a) removing the semiconductor wafer from the oxidizing liquid electrolyte;
   (b) removing the adhering non-conductive layer from the silicon substrate; and
   (c) annealing the semiconductor wafer to densify and remove liquid from the patterned oxide region.

6. A method as recited in claim 1, further comprising the step of determining a selected voltage and period of time for applying the selected voltage to the silicon substrate, the period of time together with the selected voltage determining the depth with which the patterned oxide region is formed in the silicon substrate.

7. A method as recited in claim 1, wherein the adhering non-conductive layer comprises silicon nitride.

8. A method as recited in claim 1, wherein the adhering non-conductive layer comprises photoresist.

9. A method as recited in claim 1, wherein the oxidizing liquid electrolyte comprises water.

10. A method as recited in claim 1, wherein the oxidizing liquid electrolyte comprises an ammonium compound.

11. A method as recited in claim 10, wherein the ammonium compound is selected from the group consisting of $NH_4OH$, TMAH, and TEOH.

12. A method as recited in claim 1, wherein only a portion of the silicon substrate is exposed to the oxidizing liquid electrolyte, the portion of the silicon substrate immersed in the oxidizing liquid electrolyte containing the unmasked region of the silicon substrate.

13. A method as recited in claim 12, wherein the silicon substrate is in contact with one or more drops of the oxidizing liquid electrolyte and wherein the voltage is applied across the one or more drops of the oxidizing liquid electrolyte.

14. A method as recited in claim 2, wherein the cathode is a gauze substantially comprising platinum.

15. A method as recited in claim 1, further comprising the steps of:
   (a) forming a layer of silicon upon the patterned oxide region in the silicon substrate at the unmasked region of the silicon substrate; and
   (b) forming a patterned oxide region in the layer of silicon.

16. A method as recited in claim 15, wherein the step of forming a patterned oxide region in the layer of silicon comprises the steps of:
   (a) masking the layer of silicon with an adhering non-conductive layer to leave an unmasked region of the layer of silicon;
   (b) exposing at least a portion of the layer of silicon to an oxidizing liquid electrolyte, the portion of the layer of silicon exposed to the oxidizing liquid electrolyte containing therein the unmasked region of the layer of silicon; and
   (c) applying a selected voltage to the layer of silicon through the oxidizing liquid electrolyte, thereby causing the layer of silicon to react with the oxidizing liquid electrolyte to form a patterned oxide region in the layer of silicon having a selected depth within the layer of silicon at the unmasked region of the layer of silicon.

17. A method as recited in claim 1, wherein the patterned oxide region forms an electrically insulating field oxide region.

18. A method as recited in claim 1, wherein the patterned oxide region forms an electrically insulating gate oxide layer.

19. A method for forming a patterned oxide region on a silicon substrate of a semiconductor wafer, the method comprising:
   (a) masking the silicon substrate with a generally non-conductive layer to leave an unmasked region of the silicon substrate;
   (b) exposing at least a portion of the silicon substrate to an oxidizing liquid electrolyte, the portion of the silicon substrate exposed to the oxidizing liquid electrolyte containing therein the unmasked region of the silicon substrate;
   (c) applying a voltage to the silicon substrate through the oxidizing liquid electrolyte, thereby causing the silicon substrate to react with the oxidizing liquid electrolyte to form a silicon dioxide region in the silicon substrate at the unmasked region of the silicon substrate; and (d) removing the semiconductor wafer from the oxidizing liquid electrolyte, removing the adhering non-conductive layer from the silicon substrate, and annealing the semiconductor wafer to densify and remove liquid from the silicon dioxide region.

20. A method as recited in claim 19, wherein the voltage is applied to the silicon substrate with a cathode that is in electrical contact with the oxidizing liquid electrolyte so as to create an electric field between the cathode and the silicon substrate in order to cause the silicon substrate to react with the oxidizing liquid electrolyte.

21. A method as recited in claim 19, wherein the silicon substrate is immersed in the oxidizing liquid electrolyte.

22. A method as recited in claim 19, wherein the cathode is a gauze substantially comprising platinum.

23. A method as recited in claim 19, further comprising the step of determining a selected voltage and period of time for applying the selected voltage to the silicon substrate, the period of time together with the selected voltage determining the depth with which the patterned oxide region is formed in the silicon substrate.

24. A method as recited in claim 19, wherein only a portion of the silicon substrate is exposed to the oxidizing liquid electrolyte, the portion of the silicon substrate immersed in the oxidizing liquid electrolyte containing the unmasked region of the silicon substrate.

25. A method as recited in claim 24, wherein the silicon substrate is in contact with one or more drops of the oxidizing liquid electrolyte and wherein the voltage is applied across the one or more drops of the oxidizing liquid electrolyte.

26. A method as recited in claim 19, further comprising the steps of:
(a) forming a layer of silicon upon the patterned oxide region in the silicon substrate at the unmasked region of the silicon substrate; and
(b) forming a patterned oxide region in the layer of silicon.

27. A method as recited in claim 26, wherein the step of forming a patterned oxide region in the layer of silicon comprises the steps of:
(a) masking the layer of silicon with an adhering non-conductive layer to leave an unmasked region of the layer of silicon;
(b) exposing at least a portion of the layer of silicon to an oxidizing liquid electrolyte, the portion of the layer of silicon exposed to the oxidizing liquid electrolyte containing therein the unmasked region of the layer of silicon; and
(c) applying a selected voltage to the layer of silicon through the oxidizing liquid electrolyte, thereby causing the layer of silicon to react with the oxidizing liquid electrolyte to form a patterned oxide region in the layer of silicon having a selected depth within the layer of silicon at the unmasked region of the layer of silicon.

28. A method as recited in claim 19, wherein the adhering non-conductive layer comprises silicon nitride.

29. A method as recited in claim 19, wherein the adhering non-conductive layer comprises photoresist.

30. A method as recited in claim 19, wherein the oxidizing liquid electrolyte comprises water.

31. A method as recited in claim 19, wherein the oxidizing liquid electrolyte comprises an ammonium compound.

32. A method as recited in claim 31, wherein the ammonium compound is selected from the group consisting of $NH_4OH$, TMAH, and TEOH.

33. A method as recited in claim 19, wherein the patterned oxide region forms an electrically insulating field oxide region.

34. A method as recited in claim 19, wherein the patterned oxide region forms an electrically insulating gate oxide layer.

35. A method for forming a patterned silicon dioxide region on a silicon substrate of a semiconductor wafer, the method comprising:
(a) masking the silicon substrate with a patterned layer of silicon nitride to leave an unmasked region of the silicon substrate;
(b) immersing the silicon substrate in an ammonium compound selected from the group consisting $NH_4OH$, TMAH, and TEOH;
(c) applying a selected voltage between the silicon substrate and a cathode that is in electrical contact with the oxidizing liquid electrolyte so as to create an electrical field between the cathode and the silicon substrate, thereby causing the silicon substrate to react with the ammonium compound to form a silicon dioxide region having a selected depth within the silicon substrate at the unmasked region of the silicon substrate; and
(d) removing the semiconductor wafer from the ammonium compound, removing the patterned layer of silicon nitride from the silicon substrate, and annealing the semiconductor wafer to densify and remove liquid from the silicon dioxide region.

36. A method as recited in claim 35, wherein the cathode is a gauze substantially comprising platinum.

37. A method as recited in claim 35, further comprising the steps of:
(a) forming a layer of silicon on the semiconductor wafer upon the silicon dioxide region in the silicon substrate at the unmasked region of the silicon substrate; and
(b) forming a silicon dioxide oxide region in the layer of silicon.

38. A method as recited in claim 37, wherein the step of forming a silicon dioxide oxide region in the layer of silicon comprises the steps of:
(a) masking the layer of silicon with a patterned layer of silicon nitride to leave an unmasked region of the layer of silicon;
(b) immersing at least a portion of the layer of silicon in an ammonium compound selected from the group consisting $NH_4OH$, TMAH, and TEOH, the portion of the layer of silicon immersed in the ammonium compound containing therein the unmasked region of the layer of silicon; and
(c) applying a voltage between the layer of silicon and a cathode that is in electrical contact with the ammonium compound so as to create an electrical field between the cathode and the layer of silicon, thereby causing the layer of silicon to react with the ammonium compound to form a silicon dioxide region in the layer of silicon at the unmasked region of the layer of silicon.

39. A method as recited in claim 35, wherein the patterned oxide region forms an electrically insulating field oxide region.

40. A method as recited in claim 35, wherein the patterned oxide region forms an electrically insulating gate oxide layer.

* * * * *

UNITED STATES PATENT AND TRADEMARK OFFICE
CERTIFICATE OF CORRECTION

PATENT NO. : 5,877,069
DATED : September 16, 1996
INVENTOR(S) : Karl M. Robinson It is certified that error appears in the above-identified patent and that said Letters Patent is hereby corrected as shown below:

<u>Title page,</u>
<u>Abstract,</u>
Left column, line 3, after "wafer" insert -- that --

<u>Column 6,</u>
Line 50, after "substrate" change "10" to -- 12 --
Line 65, before "including" change "contemplate" to -- contemplated --

Signed and Sealed this

Second Day of October, 2001

*Attest:*

NICHOLAS P. GODICI
*Attesting Officer*    *Acting Director of the United States Patent and Trademark Office*